(12) United States Patent
Saas et al.

(10) Patent No.: US 10,998,276 B2
(45) Date of Patent: May 4, 2021

(54) INTEGRATED CIRCUIT

(71) Applicant: Infineon Technologies AG, Neubiberg (DE)

(72) Inventors: Christoph Saas, Munich (DE); Albert Missoni, Graz (AT); Stefan Schneider, Graz (AT); Dennis Tischendorf, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/904,132

(22) Filed: Jun. 17, 2020

(65) Prior Publication Data

US 2020/0402930 A1 Dec. 24, 2020

(30) Foreign Application Priority Data

Jun. 18, 2019 (DE) .......................... 102019116468.0

(51) Int. Cl.
| | | |
|---|---|---|
| *H01L 23/00* | (2006.01) | |
| *H03K 5/01* | (2006.01) | |
| *H03K 17/16* | (2006.01) | |
| *H02M 3/07* | (2006.01) | |
| *H03K 5/00* | (2006.01) | |

(52) U.S. Cl.
CPC ............ *H01L 23/576* (2013.01); *H02M 3/07* (2013.01); *H03K 5/01* (2013.01); *H03K 17/161* (2013.01); *H03K 2005/00019* (2013.01)

(58) Field of Classification Search
None
See application file for complete search history.

(56) References Cited

U.S. PATENT DOCUMENTS

| | | |
|---|---|---|
| 2009/0251168 A1 | 10/2009 | Lisart et al. |
| 2014/0111230 A1 | 4/2014 | Lisart et al. |
| 2015/0048459 A1 | 2/2015 | Marinet et al. |
| 2018/0097058 A1 | 4/2018 | Champeix et al. |
| 2020/0303325 A1* | 9/2020 | Lewis ..................... G06F 21/75 |

FOREIGN PATENT DOCUMENTS

DE 102012110531 A1 5/2014

\* cited by examiner

*Primary Examiner* — Cassandra F Cox
(74) *Attorney, Agent, or Firm* — Schiff Hardin LLP

(57) ABSTRACT

An integrated circuit having a node that is supplied by a first supply potential and is connected to a second supply potential in such a way that a leakage current flows between the node and the second supply potential, a detection circuit that is configured to detect a signal injected between the node and the second supply potential, the temporal variation of which is fast compared to a temporal variation of the leakage current, and a compensation circuit that is configured to compensate for a deviation in the potential of the node from the first supply potential with a delay which is large compared to the temporal variation of the signal.

20 Claims, 5 Drawing Sheets

INTEGRATED CIRCUIT

TECHNICAL FIELD

Exemplary embodiments relate in general to integrated circuits.

BACKGROUND

In order to detect a current pulse in a circuit, for example to detect an attack on the circuit, a capacitance at a node in the circuit is typically charged or discharged. This can be a specially provided capacitor or else a parasitic capacitance. Typically, such a capacitance (and correspondingly the node) is charged to an operating point by a resistor or power source, and a comparator is then used to detect a change in voltage at the node corresponding to the current pulse and, if appropriate, to trigger an appropriate output signal.

For this approach to work as well as possible, the node must have a high impedance (e.g. with respect to a supply potential) in order to optimize the current-voltage conversion, so that the node can maintain the operating point for long enough. However, if a leakage current occurs at the node, the potential impedance is limited, for example due to the voltage drop across the impedance or the need to supply power to the node to maintain the operating point.

Accordingly, approaches for reliable detection of current pulses at a node with leakage losses are desirable.

SUMMARY

According to an exemplary embodiment, an integrated circuit is provided, having a node that is supplied by a first supply potential and is connected to a second supply potential in such a way that a leakage current flows between the node and the second supply potential, a detection circuit that is configured to detect a signal injected between the node and the second supply potential, the temporal variation of which signal is rapid compared to a temporal variation of the leakage current, and a compensation circuit that is configured to compensate for a deviation in the potential of the node from the first supply potential with a delay which is large compared to the temporal variation of the signal.

BRIEF DESCRIPTION OF THE FIGURES

The figures do not reflect the actual proportions, but are intended to illustrate the principles of the various exemplary embodiments. In the following text various exemplary embodiments are described with reference to the following figures.

DETAILED DESCRIPTION

The following detailed description refers to the enclosed figures, which show details and exemplary embodiments. These exemplary embodiments are described in sufficient detail to enable the person skilled in the art to embody the present disclosure. Other embodiments are also possible, and the exemplary embodiments can be modified in terms of their structural, logical and electrical aspects without deviating from the subject matter of the present disclosure. The different exemplary embodiments are not necessarily mutually exclusive, but different embodiments can be combined to create new embodiments. For the purposes of this description, the terms "connected" and "coupled" are used to describe both a direct and indirect connection, and a direct or indirect coupling.

There are various applications (e.g. for sensors), in which a current pulse at a node is designed to be converted into a corresponding voltage which is processed further. In order to convert the current into voltage efficiently and in a stable manner and to ensure reliable further processing, the node should typically have a high impedance. However, it is typically the case that leakage currents occur at such a node and a desired operating point is not held in a stable manner. Such a leakage current can change slowly, e.g. due to changes in temperature or ambient light. This means that the impedance that can be realized at this node must be limited, which adversely affects the behavior with regard to the processed voltage (e.g. when sampling the voltage).

An example of a node, the voltage (or potential) of which is to be processed, is an input node for a circuit for detecting light attacks on a data processing device.

Figure 1:
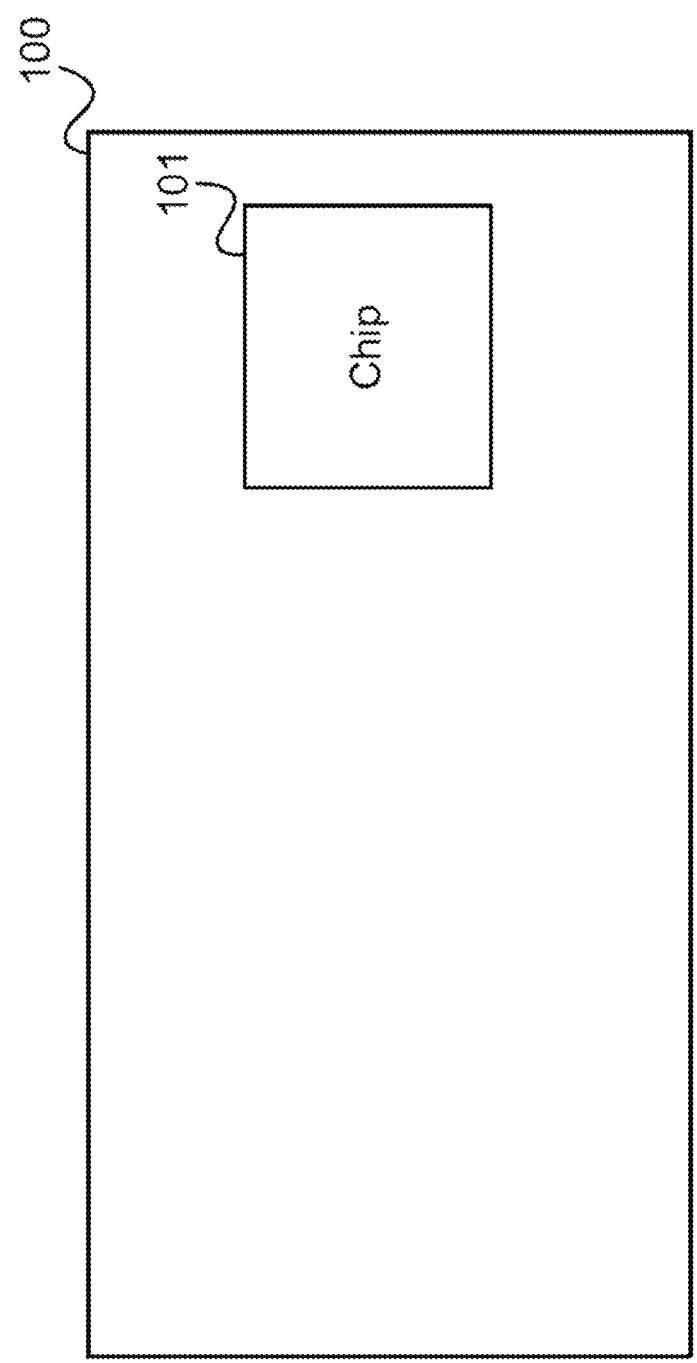
FIG. 1 shows an example of a data processing device which is to be protected against radiation attacks.

FIG. 1 shows an example of a data processing device 100 which is to be protected against radiation attacks.

The data processing device 100 can be a control unit or a microcontroller, e.g. an ECU (Electronic Control Unit) in a vehicle. It can also be a chip card IC (integrated circuit) of a chip card, such as a smart card in any form factor, e.g. for a passport or for a SIM (Subscriber Identity Module). The data processing device 100 can also be an authentication device (such as a GAD (General Authentication Device)) or a TPM (Trusted Platform Module).

The data processing device 100 has an integrated circuit, e.g. a chip 101, which is to be protected against radiation attacks. The chip can be a control chip and can implement, for example, a processor, a coprocessor (e.g. a crypto-processor) and/or a memory. The chip can also be, for example, an RFID (Radio-Frequency Identification) chip or a SIM (Subscriber Identity Module) for a mobile phone. The chip may be designed for a security application, such as storing or processing secret data, and/or be configured for authenticating a user. For example, the chip is a CMOS (Complementary Metal Oxide Semiconductor) chip.

Protection against light attacks (or radiation attacks) can be implemented by monitoring whether a charge is generated in a well (e.g. an n-well) of the chip by an attack. Charges generated by an attack are collected and generate a voltage drop across a resistor. That means that the attack detection is based on the detection of a voltage change in a well. An example of a corresponding detection circuit is described below with reference to FIG. 2.

Figure 2:
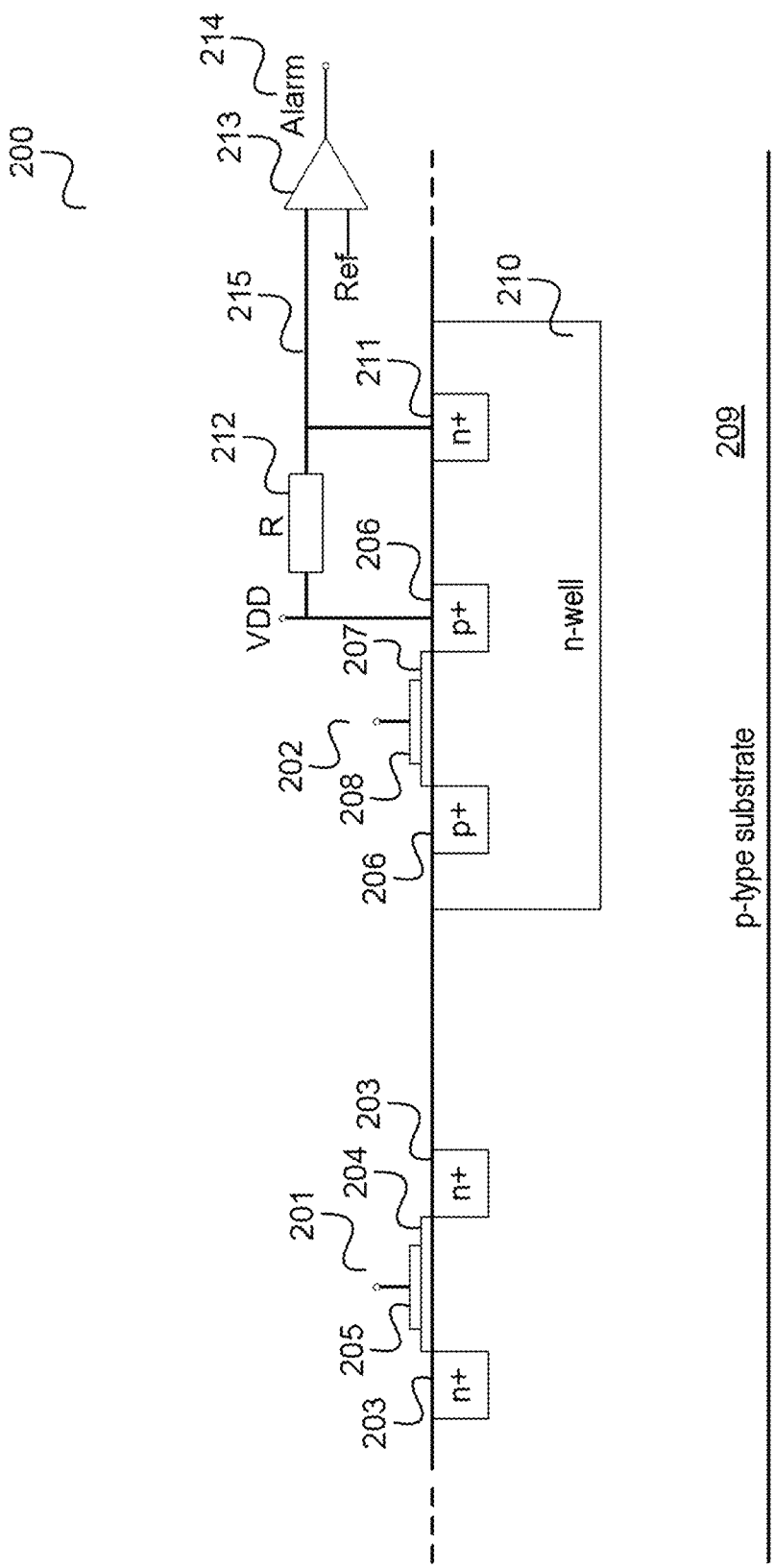
FIG. 2 shows a detection arrangement.

FIG. 2 shows a detection arrangement 200.

In this example, the detection arrangement is part of a chip, which corresponds e.g. to the chip 101, in CMOS technology. Accordingly, the chip has a plurality of nMOS transistors and a plurality of pMOS transistors. As examples of these transistors, an nMOS transistor 201 and a pMOS transistor 202 are shown.

The nMOS transistor 201 has two n-doped regions 203, an insulation layer 204 and a gate region 205.

Similarly, the pMOS transistor 202 has two p-doped regions 206, an insulation layer 207 and a gate region 208.

The nMOS transistor element 201 is arranged in a p-substrate 209. The pMOS transistor 202 is arranged in an n-well 210, which is located in the p-type substrate 209. The n-well 210 has a well connection region 211. The well connection region 211 is connected to the high supply potential (VDD) by means of a resistor 212. One of the p-doped regions 206, which serves as the source region of the pMOS transistor 202, is also connected to the high supply potential.

The well connection region 211 is also connected to an input node 215 of a comparator 213, the other input of which is connected to a reference potential.

It should be noted that FIG. 2 only shows one example, in which a CMOS logic is implemented in a p-type substrate. Other embodiments are also possible, e.g. with an n-type substrate or a triple-well implementation, in which a pMOS transistor is implemented in an n-well and an nMOS transistor is implemented in an insulated p-well within the n-well.

Since the well connection region 211 is connected to the high supply potential via resistor 212 with high impedance, discharging the n-well 210 due to an attack causes the potential of the n-well 210 to drop relative to VDD for a certain period of time. If the potential to which the n-well 210 falls is lower than the reference potential, this is detected by the comparator accordingly and an alarm signal 214 is output by the comparator.

By suitable choice of the reference potential, therefore, a light attack which leads to the discharging of the n-well 210 can be detected. The reference potential is lower than VDD, for example by a predefined tolerance, so that an alarm is not triggered by a slight change in the potential of the well 210 (which is not caused by an attack).

The impedance of the connection between the monitored node and the supply potential, in this case the resistor 212 between VDD and the comparator input node 215, should be as high as possible in order to optimize the conversion of current, in this case the charge generated by the light attack, into voltage, in this case the n-well potential, and thus to maximize the sensitivity of the detection circuit. However, the leakage current from the well (now typically dominated by pMOS GIDL (gate-induced drain leakage)) limits the maximum possible impedance: if a leakage current is present, a static voltage drop will occur across the resistor 212, resulting in a reduced potential compared to the supply potential at the comparator input node 215. Depending on the selection of the tolerance specified by the reference potential, a high leakage current can thus lead to a false alarm.

However, the tolerance cannot easily be set so high that a leakage current does not lead to a false alarm, because the leakage current can fluctuate depending on the chip ("good chip vs. bad chip") and the ambient temperature ("hot chip" vs. "cold chip"), and so, in the case of a tolerance geared towards a maximum possible leakage current (for a "hot, bad chip"), the tolerance may be too high to reliably detect an attack when the actual leakage current is low (for a "cold, good chip").

The possible leakage current can therefore be taken into account in the circuit design and the impedance of the node (in this case, the resistor 212) can be adjusted to match the expected leakage current. However, this may limit the functionality (or sensitivity) of the comparator input node 215 to dynamic effects such as attack detection, because, as explained above, a decrease in the n-well potential caused by an attack is not present for long enough to trigger an alarm, but in fact is compensated too quickly via the resistor 212. This is increasingly an issue with advanced integration technologies (<=65 nm).

With regard to this problem, according to various exemplary embodiments the leakage loss at a detection or sensor node (such as the comparator input node 215) is compensated by means of a controlled power source. This is shown in FIG. 3.

Figure 3:
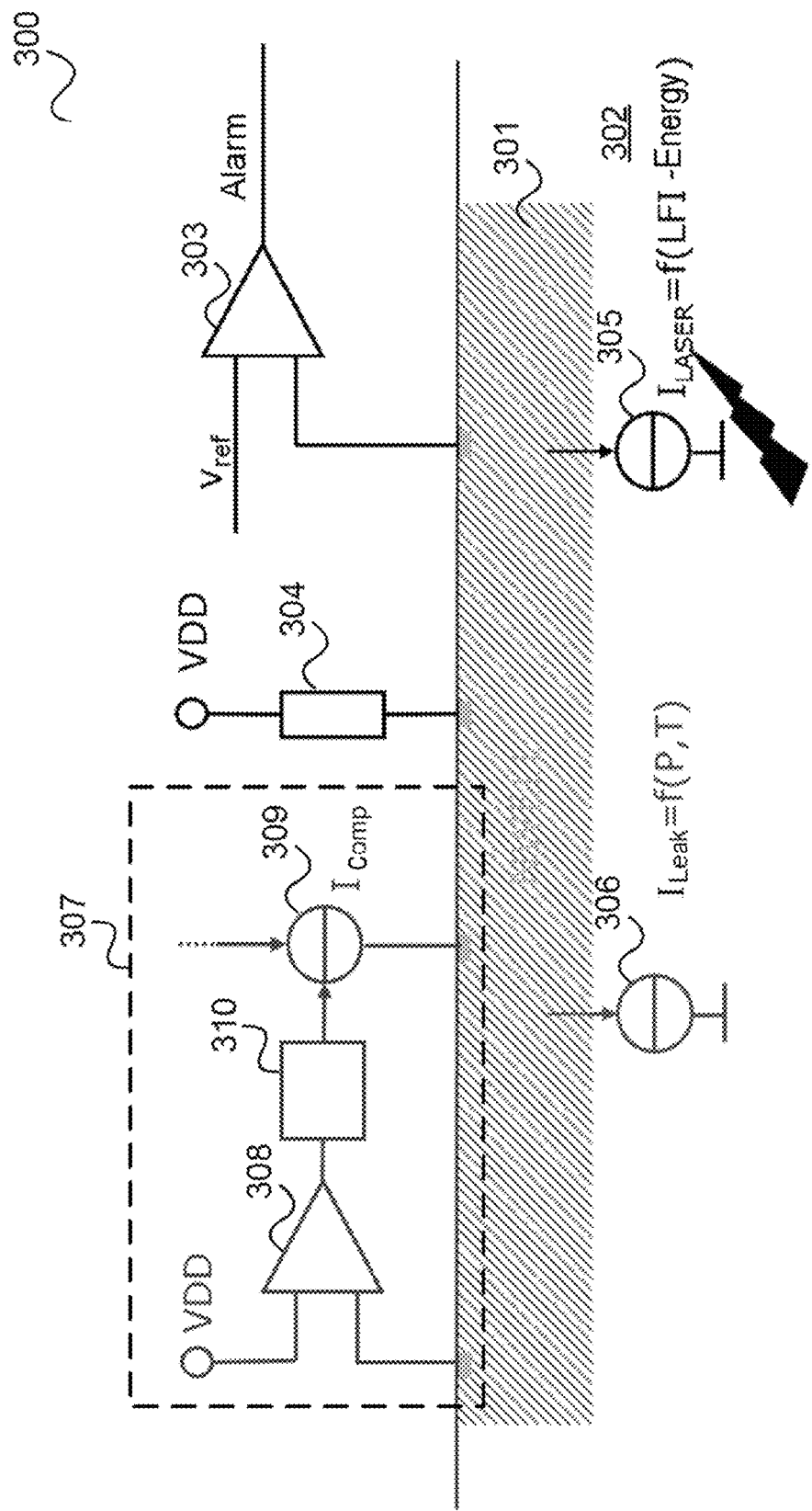
FIG. 3 shows a detection arrangement with leakage current compensation according to one embodiment.

FIG. 3 shows a detection arrangement 300 with leakage current compensation according to one embodiment.

Similarly to FIG. 2, an n-well 301 is arranged in a substrate 302. For example, the n-well 301 corresponds to the n-well 210, but the details such as well connection regions and field effect transistor components are not shown in FIG. 3. As in FIG. 2, a (first) comparator 303 is provided, of which one input node is connected to the n-well 301 and a reference potential is fed to the other input node.

In this example, the connection of the input node of the comparator 303 to the n-well 301 is implemented via the n-well 301 and a resistor 304, corresponding to the resistor 212. In this example the n-well 301 can therefore be considered as a detection or sensor node.

A light attack (e.g. laser attack) causes the n-well 301 to be discharged, as represented by a first power source 305, which causes a discharge current $I_{Laser}$ which depends on the energy of the laser fault attack (laser fault injection LFI), for example.

In addition, a leakage current $I_{Leak}$ flows out of the well, which depends on the temperature of the chip and process variations, for example, and is represented by a second power source 306.

To allow a high value to be selected for the resistor 304 without risking false alarms by the comparator 303 due to the leakage current, as described above, a leakage current compensation circuit 307 is provided.

The leakage current compensation circuit 307 has a second comparator 308, which compares the potential of the n-well 301 with the high supply potential (wherein a certain tolerance can be provided). The leakage current compensation circuit 307 also has a controlled power source 309, which is controlled based on the output signal of the second comparator 308 and supplies a compensation current $I_{Comp}$ to the n-well 301. The controlled power source 309 is supplied, for example, by the high supply potential.

To avoid reducing the dynamic sensitivity of the first comparator 303, i.e. of the attack detection, to a current pulse caused by an attack, the response of the controlled power source 309 to a drop in the n-well potential is delayed or low-pass filtered by means of a delay element or filter element 310 (e.g. a buffer, etc.). This causes the power source not to respond to rapid fluctuations in the potential of the detection node (n-well). In other words, an intentional delay or a low-pass filter is implemented in the control loop to stabilize the n-well potentials so that short fluctuations caused by attacks are not compensated and are visible to the first comparator 303. Thus, the dynamic sensitivity (to the attack detection) is balanced against the robustness to environmental influences (variation of the leakage current).

It should be noted that in the detection arrangement 300 the connection of the n-well 301 to the high supply potential VDD via resistor 304 can be omitted, since the compensation circuit 307 regulates the potential of the n-well 301 to the high supply potential.

Figure 4:
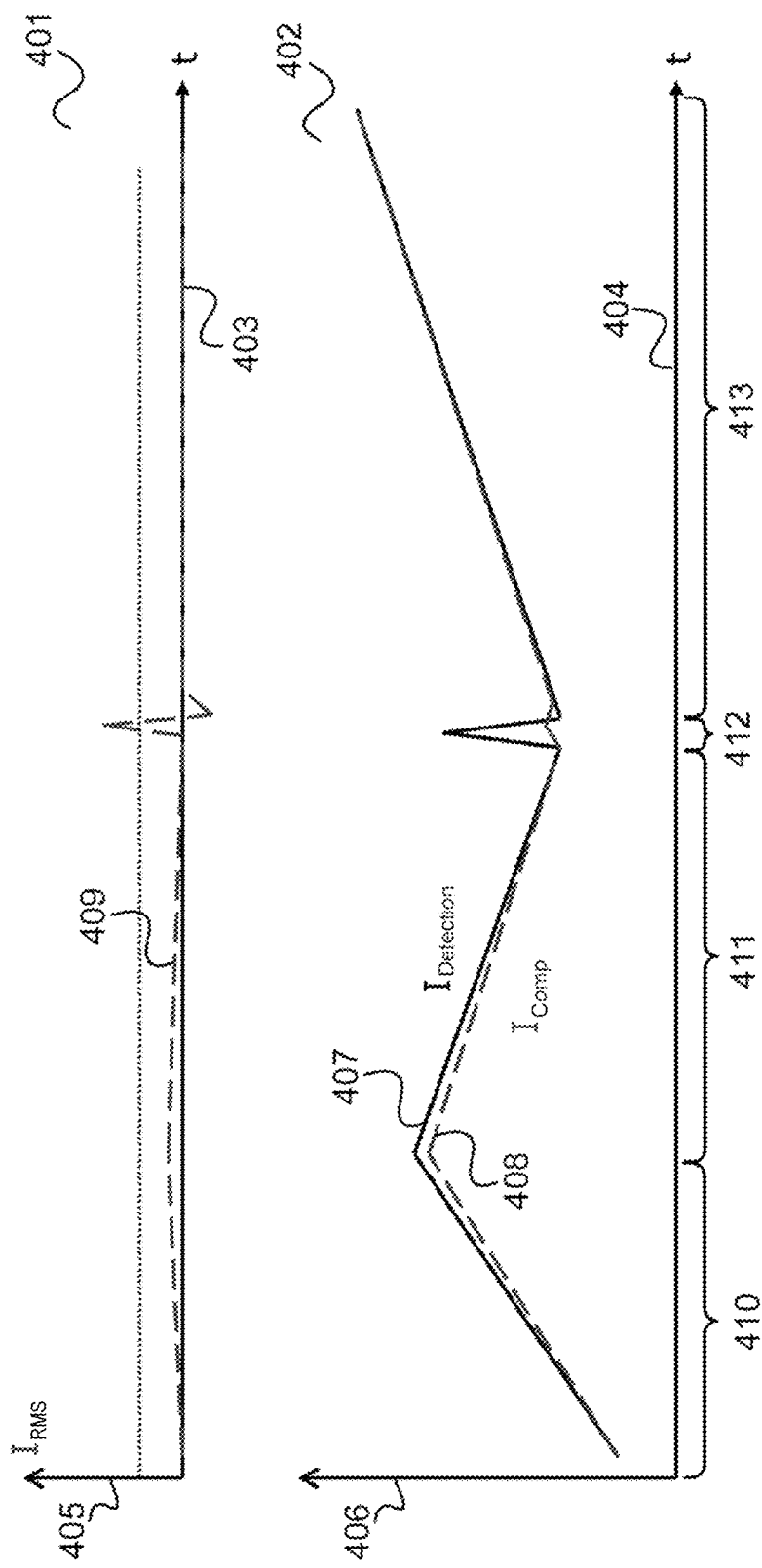
FIG. 4 shows an example of the current characteristic for the detection arrangement shown in FIG. 3.

FIG. 4 shows an example of the current characteristic for the detection arrangement shown in FIG. 3.

FIG. 4 also shows an upper diagram 401 and a lower diagram 402. The time scale along the time axes 403, 404 is the same for the two graphs and the current amplitude increases upwards along the respective current axis 405, 406 in each case.

The solid line in the lower diagram 402 shows the characteristic of the "detection current" 407, i.e. the current from the n-well 301, which results from the leakage current $I_{Leak}$ and—in the event of an attack—from the discharge current $I_{Laser}$. If present, the detection current 407 can also include the current through the resistor 304.

The lower diagram 402 also shows the characteristic of the compensation current $I_{Comp}$ 408 as a dashed line.

The dashed line in the upper diagram 403 shows the rms current $I_{RMS}$ 409 from the n-well 301, i.e. the difference between the detection current 407 and the compensation current 408.

In this example the leakage current, and thus the detection current 407, increases in the first time interval 410 (for example, because the chip continues to heat up after switching on). Due to the delay (or the low-pass filter) in the compensation circuit 307, the compensation current 408 follows the detection current 407 with a delay, so that the rms current 409 initially increases.

In a second time interval 410, the leakage current decreases and the compensation current 408 starts to catch up with the detection current 407, so that the rms current 409 becomes zero.

An attack occurs in a third time interval 412. Accordingly, the detection current has a current peak, which due to the delay (or the low-pass filter) in the compensation circuit 307 is only affected slightly by the compensation circuit 307. Accordingly, the potential of the n-well 301 drops off and the first comparator 303 detects an attack.

After the current peak, the rms current 409 is briefly negative, as the compensation circuit 307 supplies charge to the n-well 301 to bring it back up to VDD.

In a fourth time interval 413, the compensation circuit 307 has adjusted to the (increasing) leakage current, so that the rms current 409 is zero.

Any circuit that supplies the lost charge is suitable for implementing the compensation circuit 307. This can be achieved by means of a control loop, which, as described, has a dead time that is longer than a typical attack current pulse in order not to affect the attack detection result.

As shown in FIG. 3, a power source can be used that is supplied by a higher potential and is controlled or driven by a differential amplifier. The power source can also be integrated into the differential amplifier itself, allowing a compact design to be achieved. One possible approach is a differential stage plus output stage, which is supplied by a suitable supply potential. If no adequate supply is available, a charge pump can be used to implement the power source and deliver the required charge from an available supply. In both approaches, the intrinsic delay (of the differential amplifier and power source circuit) might not be sufficient to avoid affecting the attack detection result (or, more generally, a conversion result). Therefore, as shown in FIG. 3, an additional delay can be provided in the control loop, which delay can also be provided at the input of the differential amplifier. A similar effect can also be achieved by overcompensation of the control loop.

Figure 5:
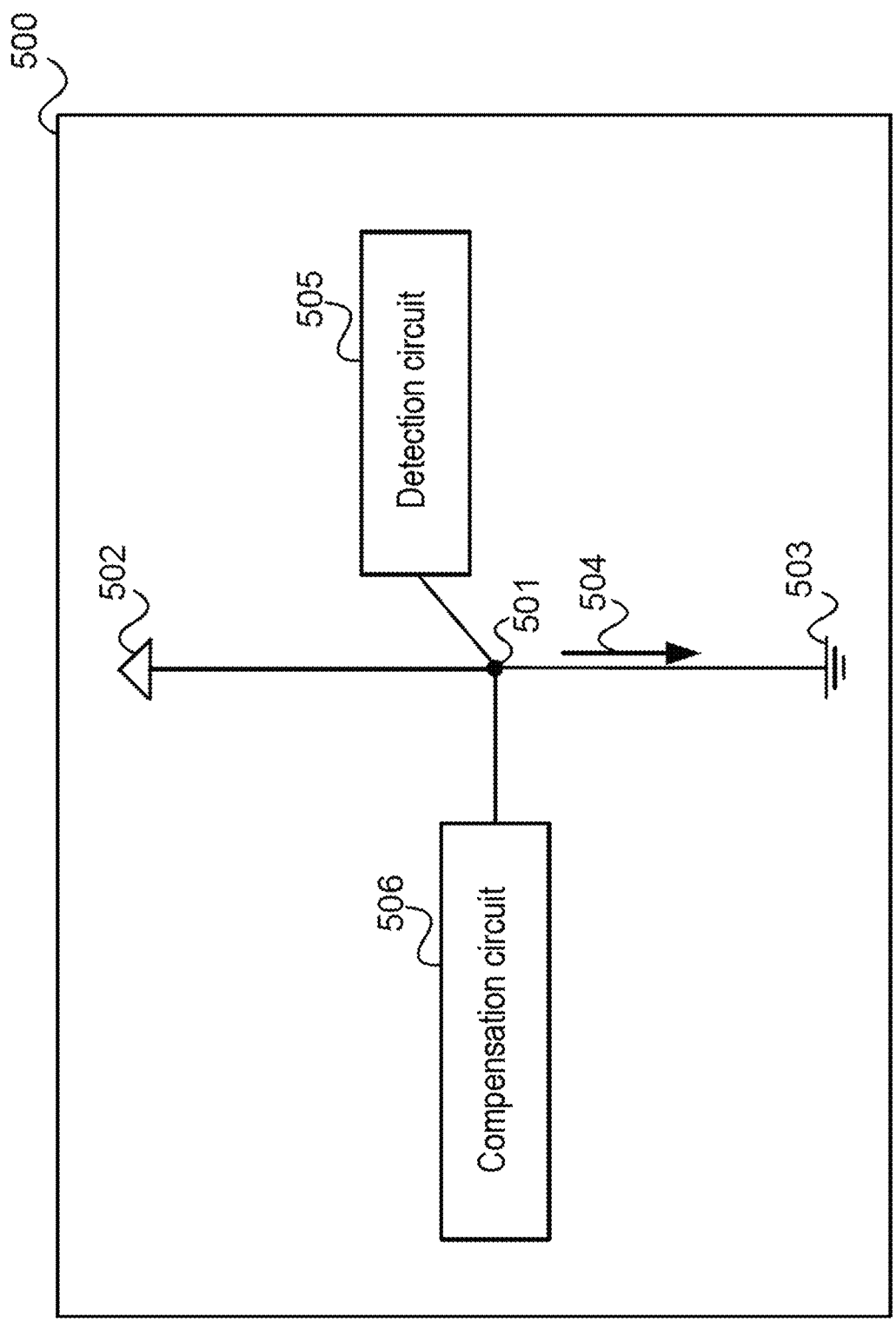
FIG. 5 shows an integrated circuit according to one embodiment.

In summary, according to various embodiments an integrated circuit as shown in FIG. 5 is provided.

FIG. 5 shows an integrated circuit 500 according to one embodiment.

The integrated circuit 500 has a node 501 which is supplied by a first (e.g. high) supply potential 502 (for example via a resistor) and is connected to a second (e.g. low) supply potential 503, in such a way that a leakage current 504 flows between the node 501 and the second supply potential 503.

The integrated circuit 500 also has a detection circuit 505 which is configured to detect a signal injected between the node 501 and the second supply potential 503, the temporal variation of which is rapid compared to a temporal variation of the leakage current 504.

In addition, the integrated circuit 500 has a compensation circuit 506 which is configured to compensate for a deviation of the potential of the node 501 from the first supply potential 502 with a delay that is large compared to the temporal variation of the signal.

In other words, at a node where leakage losses occur a control capability is provided, wherein a deliberately slow (i.e. delayed) leakage current compensation is provided which compensates for leakage current variation, e.g. due to temperature, but does not react quickly enough to conceal a current peak (and the corresponding change in potential) due to a laser attack, for example. Therefore, the measurement, for example for attack detection, is not adversely affected by the leakage loss compensation. Nevertheless, the leakage loss compensation fulfils its function and allows, for example, a high impedance of the node, in particular a high-impedance connection of the node to the first supply potential.

High impedance can be understood in this case to mean that the impedance is in the kilohm range, e.g. in the range 1 kΩ-100 kΩ. With compensation, however, e.g. according to the exemplary embodiment of FIG. 5, values up to a few MΩ can also be implemented, e.g. a value in the range of 1 MΩ-10 MΩ.

In the following text, various exemplary embodiments are specified.

Exemplary embodiment 1 is an integrated circuit, as shown in FIG. 5.

Exemplary embodiment 2 is an integrated circuit according to exemplary embodiment 1, wherein the detection circuit is configured to output an alarm signal if the potential of the node deviates from the first supply potential by more than the predefined tolerance.

Exemplary embodiment 3 is an integrated circuit according to exemplary embodiment 1 or 2, wherein the compensation circuit is dimensioned to compensate for the leakage current.

Exemplary embodiment 4 is an integrated circuit according to any one of the exemplary embodiments 1 to 3, wherein the detection circuit is designed such that its response time is so short that the detection circuit detects a deviation of the potential of the node from the first supply potential by more than a predefined tolerance within the duration of a potential drop due to a light/laser attack.

Exemplary embodiment 5 is an integrated circuit according to any one of the exemplary embodiments 1 to 4, wherein the node is a well in a substrate.

Exemplary embodiment 6 is an integrated circuit according to exemplary embodiment 5, wherein the first supply potential is a high supply potential and the second supply potential is a low supply potential and the node is an n-well.

Exemplary embodiment 7 is an integrated circuit according to exemplary embodiment 5, wherein the first supply potential is a low supply potential and the second supply potential is a high supply potential and the node is a p-well.

Exemplary embodiment 8 is an integrated circuit according to any one of the exemplary embodiments 1 to 7, wherein the leakage current is a leakage current through a pn-junction.

Exemplary embodiment 9 is an integrated circuit according to any one of exemplary embodiments 1 to 8, wherein the compensation circuit has a further detection circuit, which is configured to detect when the potential of the node deviates from the first supply potential by more than an additional predefined tolerance.

Exemplary embodiment 10 is an integrated circuit according to exemplary embodiment 9, wherein the compensation circuit has a controlled power source which is arranged in such a way that it is controlled based on the output of the other detection circuit.

Exemplary embodiment 11 is an integrated circuit according to exemplary embodiment 10, wherein the controlled power source is supplied by the first supply potential.

Exemplary embodiment 12 is an integrated circuit according to exemplary embodiment 10 or 11, wherein the controlled power source has a charge pump.

Exemplary embodiment 13 is an integrated circuit according to any one of the exemplary embodiments 1 to 12, wherein the compensation circuit has a delay element and/or a filter element that is dimensioned such that the compensation circuit compensates for a deviation of the potential of the node from the first supply potential with a delay that is large compared to the temporal variation of the signal.

Exemplary embodiment 14 is an integrated circuit according to any one of the exemplary embodiments 1 to 13, wherein the node is connected to the first supply potential via a resistor.

Exemplary embodiment 15 is an integrated circuit according to any one of the exemplary embodiments 1 to 14, wherein the node is connected to the first supply potential with high impedance.

Exemplary embodiment 16 is an integrated circuit according to any one of exemplary embodiments 1 to 15, wherein the compensation circuit is designed with such a delay that the compensation circuit reacts so quickly to variations in the leakage current due to temperature that it prevents any deviation of the potential of the node from the first supply potential by more than the predefined tolerance due to the leakage current.

Exemplary embodiment 17 is an integrated circuit according to any one of exemplary embodiments 1 to 16, wherein the compensation circuit is designed with a delay that is an order of magnitude or more higher than the temporal variation of the signal.

Exemplary embodiment 18 is an integrated circuit according to any one of the exemplary embodiments 1 to 17, wherein the detection circuit is configured to detect the injected signal by detecting that the potential of the node deviates from the first supply potential by more than the predefined tolerance.

Exemplary embodiment 19 is an integrated circuit according to exemplary embodiment 18, wherein the detection circuit has a response time after which it detects a deviation of the potential of the node from the first supply potential by more than the predefined tolerance and the delay of the compensation circuit is at least as great as the response time of the detection circuit.

Exemplary embodiment 20 is a chip card having an integrated circuit according to any one of the exemplary embodiments 1 to 19.

Another exemplary embodiment is an integrated circuit having a node that is supplied from a first supply potential via a resistor and is connected to a second supply potential in such a way that a leakage current flows between the node and the second supply potential, a detection circuit that is configured to detect when the potential of the node deviates by more than a predefined tolerance from the first supply potential, wherein the detection circuit has a response time after which it detects a deviation of the potential of the node from the supply potential by more than the specified tolerance, and a compensation circuit that is configured to compensate for a deviation of the potential of the node from the first supply potential with a delay that is at least as large as the response time of the detection circuit (for example, greater by at least one order of magnitude, e.g. at least by a factor of 10).

Although the present disclosure has mainly been shown and described by reference to specific embodiments, it should be understood by those familiar with the technical field that numerous changes can be made with regard to its design and details without departing from the nature and scope of the present disclosure, as defined by the following claims. The scope of the present disclosure is therefore defined by the attached claims and it is intended that any changes that fall within the literal meaning or equivalent scope of the claims are included.

LIST OF REFERENCE SIGNS 100 data processing device
101 chip
200 detection arrangement
201 nMOS transistor
202 pMOS transistor
203 n-doped regions
204 insulation layer
205 gate region
206 p-doped regions
207 insulation layer
208 gate region
209 p-type substrate
210 n-well
211 well connection region
212 resistor
213 comparator
214 alarm signal
215 comparator input node
300 detection arrangement
301 n-well
302 substrate
303 comparator
304 resistor
305, 306 power sources
307 leakage current compensation circuit
308 comparator
309 controlled power source
310 delay or filter element
401, 402 diagrams
403, 404 time axes
405, 406 current axes
407 detection current
408 compensation current
409 RMS current
410-413 time intervals
500 integrated circuit
501 node
502, 503 supply potentials
504 leakage current
505 detection circuit
506 compensation circuit

The invention claimed is:
1. An integrated circuit, comprising:

a node configured to be supplied by a first supply potential and connected to a second supply potential in such a way that a leakage current flows between the node and the second supply potential;

a detection circuit configured to detect a signal injected between the node and the second supply potential, the temporal variation of which signal is rapid compared to a temporal change in the leakage current; and a compensation circuit configured to compensate for a deviation of the potential of the node from the first supply potential with a delay that is large compared to the temporal variation of the signal.

2. The integrated circuit as claimed in claim 1, wherein the detection circuit is configured to output an alarm signal if the potential of the node deviates from the first supply potential by more than a predefined tolerance.

3. The integrated circuit as claimed in claim 1, wherein the compensation circuit is dimensioned to compensate for the leakage current.

4. The integrated circuit as claimed in claim 1, wherein the detection circuit is designed such that its response time is so short that the detection circuit detects a deviation of the potential of the node from the first supply potential by more than a predefined tolerance within a duration of a potential drop due to a light/laser attack.

5. The integrated circuit as claimed in claim 1, wherein the node is a well in a substrate.

6. The integrated circuit as claimed in claim 5, wherein the first supply potential is a high supply potential and the second supply potential is a low supply potential, and the node is an n-well.

7. The integrated circuit as claimed in claim 5, wherein the first supply potential is a low supply potential and the second supply potential is a high supply potential, and the node is a p-well.

8. The integrated circuit as claimed in claim 1, wherein the leakage current is a leakage current through a pn-junction.

9. The integrated circuit as claimed in claim 2, wherein the detection circuit has a further detection circuit, which is configured to detect when the potential of the node deviates from the first supply potential by more than an additional predefined tolerance.

10. The integrated circuit as claimed in claim 9, wherein the compensation circuit has a controlled power source, arranged in such a way that it is controlled based on the output of the further detection circuit.

11. The integrated circuit as claimed in claim 10, wherein the controlled power source is supplied by the first supply potential.

12. The integrated circuit as claimed in claim 10, wherein the controlled power source has a charge pump.

13. The integrated circuit as claimed in claim 1, wherein the compensation circuit has a delay element and/or a filter element that is dimensioned such that the compensation circuit compensates for a deviation of the potential of the node from the first supply potential with a delay that is large compared to the temporal variation of the signal.

14. The integrated circuit as claimed in claim 1, wherein the node is connected to the first supply potential via a resistor.

15. The integrated circuit as claimed in claim 1, wherein the node is connected to the first supply potential with high impedance.

16. The integrated circuit as claimed in claim 1, wherein the compensation circuit is designed with a delay such that the compensation circuit reacts so quickly to variations in the leakage current due to the temperature that it prevents any deviation of the potential of the node from the first supply potential by more than the predefined tolerance due to the leakage current.

17. The integrated circuit as claimed in claim 1, wherein the compensation circuit is designed with a delay that is an order of magnitude or more higher than the temporal variation of the signal.

18. The integrated circuit as claimed in claim 1, wherein the detection circuit is configured to detect the injected signal by detecting that the potential of the node deviates from the first supply potential by more than the predefined tolerance.

19. The integrated circuit as claimed in claim 18, wherein the detection circuit has a response time after which it detects a deviation of the potential of the node from the first supply potential by more than the predefined tolerance, and the delay of the compensation circuit is at least as great as the response time of the detection circuit.

20. A chip card having an integrated circuit as claimed in claim 1.

* * * * *